(12) United States Patent
Shinada et al.

(10) Patent No.: US 11,581,171 B2
(45) Date of Patent: Feb. 14, 2023

(54) CATHODE UNIT AND FILM FORMING APPARATUS

(71) Applicant: Tokyo Electron Limited, Tokyo (JP)

(72) Inventors: Masato Shinada, Tokyo (JP); Einstein Noel Abarra, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/172,327

(22) Filed: Feb. 10, 2021

(65) Prior Publication Data

US 2021/0257198 A1 Aug. 19, 2021

(30) Foreign Application Priority Data

Feb. 18, 2020 (JP) .............................. JP2020-024918

(51) Int. Cl.
| | |
|---|---|
| *H01J 37/34* | (2006.01) |
| *C23C 14/34* | (2006.01) |
| *C23C 14/35* | (2006.01) |
| *C23C 14/16* | (2006.01) |

(52) U.S. Cl.
CPC ...... *H01J 37/3435* (2013.01); *C23C 14/3407* (2013.01); *C23C 14/35* (2013.01); *H01J 37/3408* (2013.01); *H01J 37/3417* (2013.01); *H01J 37/3426* (2013.01); *H01J 37/3455* (2013.01); *H01J 37/3497* (2013.01); *C23C 14/165* (2013.01); *C23C 14/352* (2013.01)

(58) Field of Classification Search
CPC .............. H01J 37/3435; H01J 37/3455; H01J 37/3408; H01J 37/3417; C23C 14/3407; C23C 14/35; F28F 1/40
See application file for complete search history.

(56) References Cited

U.S. PATENT DOCUMENTS

| | | | | |
|---|---|---|---|---|
| 4,780,190 A | * | 10/1988 | Vranken | H01J 37/3405 204/192.12 |
| 5,382,344 A | * | 1/1995 | Hosokawa | C23C 14/35 204/298.23 |
| 6,199,259 B1 | * | 3/2001 | Demaray | C23C 14/3407 228/221 |

FOREIGN PATENT DOCUMENTS

| | | | | |
|---|---|---|---|---|
| EP | 780487 A1 | * | 6/1997 | ......... C23C 14/3407 |
| JP | 2008255452 A | * | 10/2008 | |
| JP | 2015132420 A | * | 7/2015 | ......... F28D 21/0003 |
| JP | 2018-523752 A | | 8/2018 | |

* cited by examiner

*Primary Examiner* — Michael A Band
(74) *Attorney, Agent, or Firm* — Venjuris, P.C.

(57) ABSTRACT

A cathode unit for performing a sputtering film formation includes: a target that emits sputtering particles; a target cooler that includes a cooling plate to which the target is bonded; and a power supply that supplies a power to the target. The target has a high-temperature region that has a higher temperature than other regions of the target during a film formation. The cooling plate includes a coolant flow space through which a coolant flows, and a first wall and a second wall that define the coolant flow space in a thickness direction. In the coolant flow space, a flow path of the coolant is formed by a first partition plate and a second partition plate. The first partition plate does not exist at a portion of the coolant flow space that corresponds to the high-temperature region.

11 Claims, 8 Drawing Sheets

OVERLAPPING REGIONS

OVERLAPPING REGIONS

CATHODE UNIT AND FILM FORMING APPARATUS

CROSS-REFERENCE TO RELATED APPLICATIONS

The present application is based on and claims priority from Japanese Patent Application No. 2020-024918, filed on Feb. 18, 2020, with the Japan Patent Office, the disclosure of which is incorporated herein in its entirety by reference.

TECHNICAL FIELD

The present disclosure relates to a cathode unit and a film forming apparatus.

BACKGROUND

A sputtering in which sputtering particles generated from a target are deposited to form a film on a substrate has been used as a technique for forming a metal film. Japanese Patent Laid-Open Publication No. 2018-523752 describes an apparatus which performs a sputtering deposition on a substrate. This apparatus includes a vacuum chamber and a sputtering source. The sputtering source includes a packing support member having a target receiving surface. The surface of the packing support member that is opposite to the target receiving surface faces a magnet assembly. The packing support member includes a cooling channel that includes a cooling liquid, and is configured to be cooled.

SUMMARY

According to an aspect of the present disclosure, a cathode unit for performing a sputtering film formation, the cathode unit including: a target configured to emit sputtering particles; a target cooler that includes a cooling plate made of a metal to which the target is bonded; and a power supply configured to supply a power to the target. The target has a high-temperature region that has a higher temperature than other regions of the target during a film formation. The cooling plate includes a cooling medium flow space through which a cooling medium flows, and a first wall and a second wall that define the cooling medium flow space in a thickness direction. In the cooling medium flow space, a flow path of the cooling medium is formed by a first partition plate connected to the first wall and the second wall and a second partition plate connected to only one of the first wall and the second wall. The first partition plate does not exist at a portion of the cooling medium flow space that corresponds to the high-temperature region.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION OF THE DRAWINGS

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, embodiments will be described in detail with reference to the accompanying drawings.

<Configuration of Film Forming Apparatus>

Figure 1:
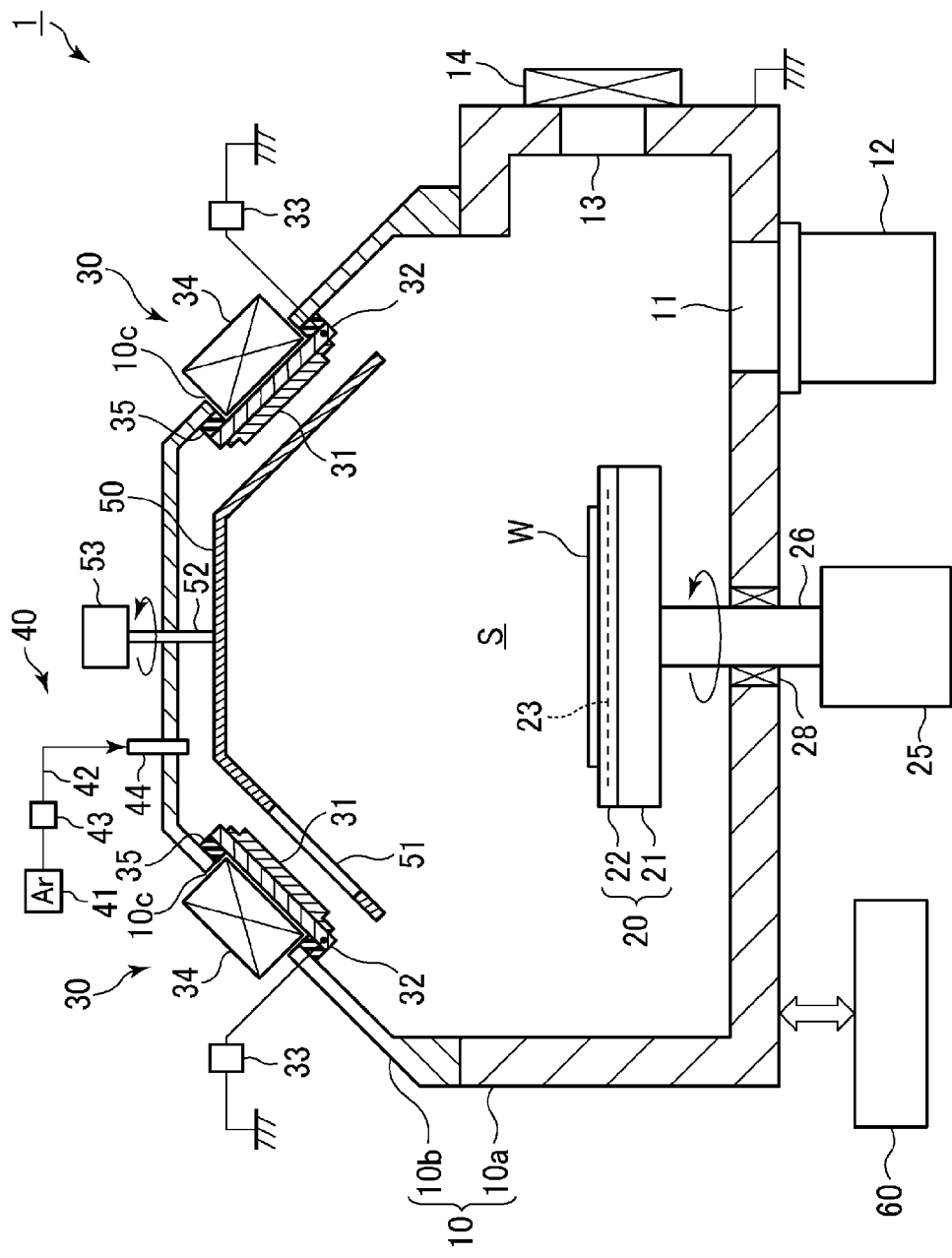
FIG. 1 is a cross-sectional view illustrating an example of a film forming apparatus that includes a cathode unit according to an embodiment.
Figure 2:
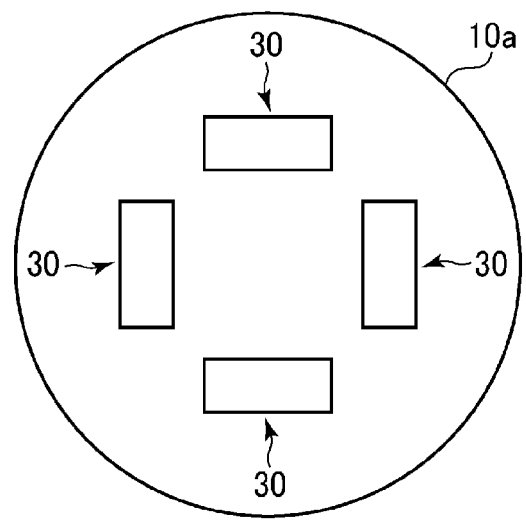
FIG. 2 is a schematic plan view illustrating an example of the film forming apparatus that includes the cathode unit according to the embodiment.

FIG. 1 is a cross-sectional view illustrating an example of a film forming apparatus that includes a cathode unit according to an embodiment, and FIG. 2 is a schematic plan view thereof.

A film forming apparatus 1 of the present embodiment forms a film of a metal, alloy or compound on a substrate W through a sputtering. The substrate W is not specifically limited, and examples thereof may include a semiconductor wafer having a semiconductor substrate such as Si.

The film forming apparatus 1 includes a processing container 10, a substrate holder 20, a cathode unit 30, a gas supply 40, a shutter 50, and a controller 60.

The processing container 10 is made of, for example, aluminum, and defines a processing chamber in which a processing is performed on the substrate W. The processing container 10 is connected to the ground potential. The processing container 10 includes a container body 10a opened at the upper portion thereof, and a lid 10b provided to close the upper opening of the container body 10a. The lid 10b has a substantially truncated cone shape.

An exhaust port 11 is formed at the bottom of the processing container 10, and an exhaust device 12 is connected to the exhaust port 11. The exhaust device 12 includes a pressure control valve and a vacuum pump, and the inside of the processing container 10 is evacuated to a predetermined degree of vacuum by the exhaust device 12.

A carry-in/out port 13 is formed in the side wall of the processing container 10, to perform a carry-in/out of the substrate W with respect to an adjacent transfer chamber (not illustrated). The carry-in/out port 13 is opened and closed by a gate valve 14.

The substrate holder 20 has a substantially disc shape, is provided near the bottom of the processing container 10 inside the processing container 10, is configured to hold the substrate W horizontally. The substrate holder 20 has a base 21 and an electrostatic chuck 22. The base 21 is made of, for example, aluminum. The electrostatic chuck 22 is made of a dielectric material, and includes an electrode 23 therein. A DC voltage is applied to the electrode 23 from a DC power supply (not illustrated), and the substrate W is electrostatically adsorbed to the surface of the electrostatic chuck 22 by the electrostatic force generated by the DC voltage.

Further, a temperature control mechanism (not illustrated) may be provided inside the substrate holder 20. As the temperature control mechanism, for example, a mechanism that enables a temperature control medium to flow in the substrate holder 20, or a heater may be used.

The substrate holder 20 is connected to a driving device 25 provided below the processing container 10, via a support shaft 26. The support shaft 26 extends from the driving device 25 while penetrating the bottom wall of the processing container 10, and the tip of the support shaft 26 is connected to the center of the bottom surface of the substrate holder 20. The driving device 25 is configured to rotate and move the substrate holder 20 up and down via the support shaft 26. The space between the support shaft 26 and the bottom wall of the processing container 10 is sealed by a sealing member 28. By providing the sealing member 28, the support shaft 26 may rotate and move up and down while keeping the inside of the processing container 10 in a vacuum state. Examples of the sealing member 28 may include a magnetic fluid seal.

The cathode unit 30 includes a target 31, and is provided on the inclined surface of the lid 10b of the processing container 10. As illustrated in FIG. 2, in this example, four cathode units 30 are provided at the same height position at equal intervals. The number of cathode units is not limited to four, and may be any number of one or more. The details of the cathode unit 30 will be described in detail later.

The gas supply 40 includes a gas source 41, a gas supply pipe 42 that extends from the gas source 41, a flow rate controller 43 provided in the gas supply pipe 42 such as a mass flow controller, and a gas introduction member 44. An inert gas, for example, a rare gas such as Ar, Ne, or Kr (FIG. 1 represents an example in which Ar gas is used) is supplied as a plasma generating gas to be excited in the processing container 10, from the gas source 41 into the processing container 10 through the gas supply pipe 42 and the gas introduction member 44. The gas supplied into the processing container 10 is excited when a voltage is supplied to the target 31.

The shutter 50 has a function of shielding the targets 31 that are not used for a film formation. The shutter 50 has a truncated cone shape along the lid 10b of the processing container 10, has a sufficient size enough to cover the projection area of four targets 31, and has an opening 51 in a size slightly larger than each target 31. The opening 51 is associated with the target 31 that is used for the film formation, and the shutter 50 shields the other targets 31. The shutter 50 is mounted to be freely rotatable via a rotary shaft 52 provided at the center of the ceiling of the processing container 10. The rotary shaft 52 is connected to a rotation mechanism 53 provided above the processing container 10, and the shutter 50 is rotated by the rotation mechanism 53.

The controller 60 includes a computer, and is provided with a main controller that includes a CPU configured to control each component of the film forming apparatus 1. Further, the controller 60 includes an input device such as a keyboard or a mouse, an output device, a display device, and a storage device. The main controller of the controller 60 sets a storage medium in which a processing recipe is stored, in the storage device, thereby causing the film forming apparatus 1 to perform predetermined operations based on the processing recipe called from the storage medium.

<Cathode Unit>

Figure 3:
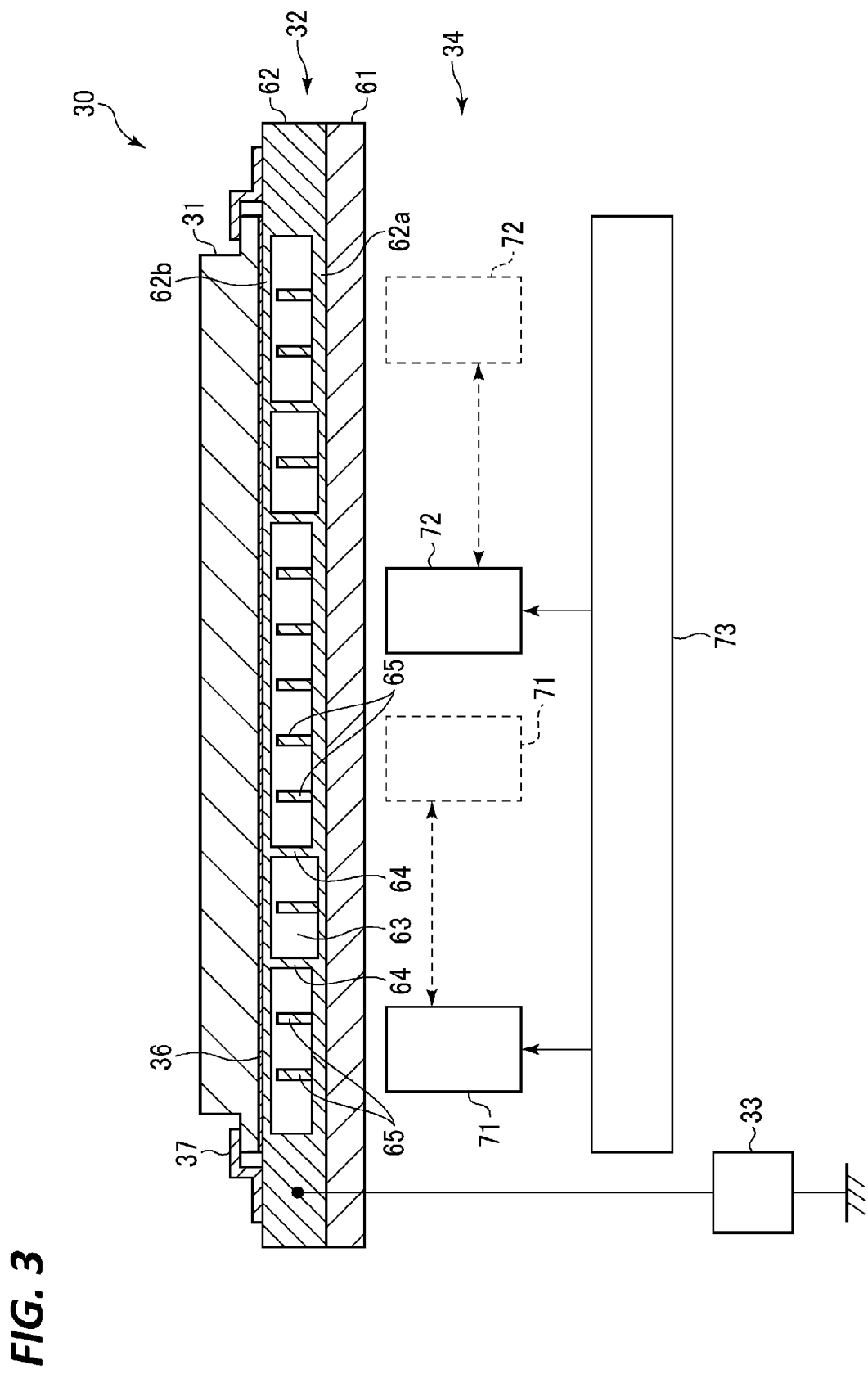
FIG. 3 is a cross-sectional view illustrating the cathode unit according to the embodiment.
Figure 4:
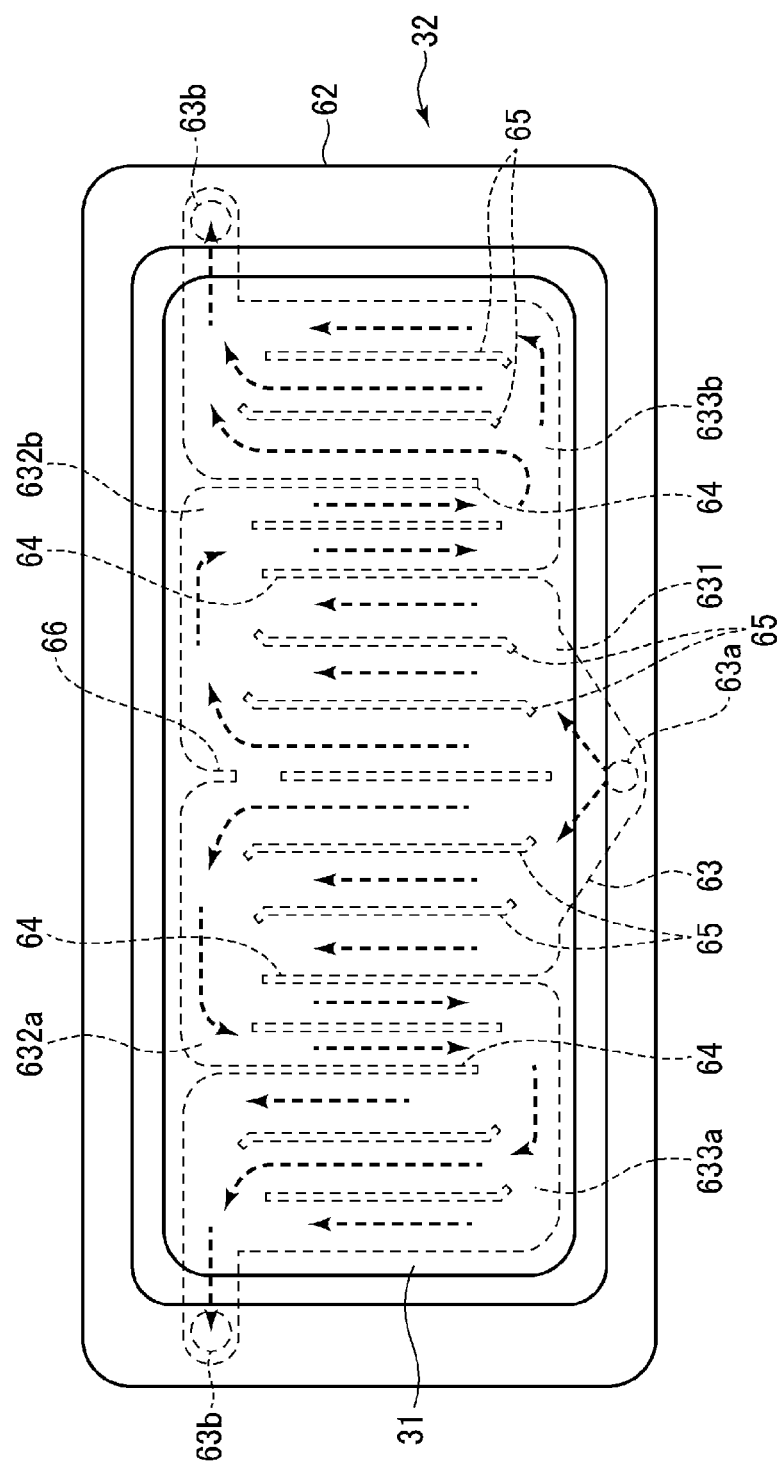
FIG. 4 is a plan view illustrating the cathode unit according to the embodiment.

FIG. 3 is a cross-sectional view illustrating the cathode unit, and FIG. 4 is a plan view thereof. As illustrated in FIG. 3, the cathode unit 30 includes the target 31, a target cooler 32 that holds and cools the target 31, a power supply 33 that supplies a power to the target 31, and a magnet assembly 34.

The target 31 is made of a metal, alloy, or compound that makes up a film to be deposited, and has a rectangular planar shape. The material of the target 31 is appropriately selected according to a film to be formed. As the material of the target 31, a low-thermal-conductivity material having a lower thermal conductivity than that of cobalt (Co), for example, titanium (Ti) or ceramics (e.g., alumina) may be used. The four targets 31 may be made of different materials, or may be made of the same material. When a voltage is applied to the target 31, sputtering particles are emitted. During the film formation, the voltage may be applied to one or more targets 31 so as to emit the sputtering particles.

The target cooler 32 is mounted on the internal side of a hole portion 10c formed in the inclined surface of the lid 10b of the processing container 10 via an insulating member 35, and provided on the back surface of the target 31. The target cooler 32 includes a base plate 61 and a cooling plate 62, and has a rectangular shape that corresponds to the target 31. The cooling plate 62 and the target 31 are bonded to each other. For the bonding, for example, a bonding material 36 made of indium (In), gallium (Ga), tin (Sn), silver (Ag) or an alloy thereof (e.g., In—Sn) may be used. Since the bonding material has a relatively low melting point, the target 31 is easily removable. For the bonding, a diffusion bonding may be used. A flange is formed on the outer periphery of the target 31, and the flange and the cooling plate 62 are fixed by a clamp ring 37.

The base plate 61 is made of a metal, and provided to support the cooling plate 62. While the metal that makes up the base plate 61 is not specifically limited, for example, aluminum (Al), copper (Cu), molybdenum (Mo) or stainless steel may be used.

The cooling plate 62 is made of a metal, and has a cooling medium flow space 63 therein. As the metal that makes up the cooling plate 32, for example, Al, Cu, Mo or stainless steel may be used as that for the base plate 61. As the material of the cooling plate 32, Cu having a relatively high thermal conductivity is suitable. The cooling plate 62 may be integrated with the base plate 61.

The cooling plate 62 includes a first wall 62a on the side of the base plate 61 and a second wall 62b on the side of the target 31 to define the cooling medium flow space 63 in the thickness direction. As a cooling medium, water (cooling water) may be used. A cooling medium inlet 63a is provided at the center of one long side of the cooling plate 62, and cooling medium outlets 63b are provided at both short sides of the cooling plate 62 close to the other long side of the cooling plate 62. Accordingly, the cooling medium is introduced into the cooling medium flow space 63 from the cooling medium inlet 63a, flows along flow paths to be described later, and then, is discharged from the cooling medium outlets 63b.

The cooling medium is required to flow through the cooling medium flow space 63 along the flow paths in a rectified state without entraining a gas. Thus, the cooling plate 62 is horizontal in the long-side direction thereof, and is inclined in the short-side direction thereof to rise from the cooling medium inlet 63a toward the cooling medium outlets 63b. The cooling plate 62 may be vertical in the short-side direction thereof such that the cooling medium inlet 63a is placed down. The target 31 may also be placed in the same direction as that of the cooling plate 62.

The cooling medium flow space 63 is divided by a plurality of first partition plates 64 and a plurality of second partition plates 65 that extend in the short-side direction, and as a result, the flow paths are formed. Each first partition plate 64 is provided to form a flow path where the flow direction of the cooling medium is curved, and each second partition plate 65 is provided to form flow paths where the cooling medium flows in parallel in the same direction (see, e.g., FIG. 4).

The first partition plates 64 are connected to both the first wall 62a and the second wall 62b of the cooling plate 62, and the second partition plates 65 are connected only to the first wall 62a. The cooling plate 62 may be manufactured by, for example, preparing a main body in which the first and second partition plates 64 and 65 extend from the first wall 62a, and bonding a plate material to serve as the second wall 62b to the periphery of the main body and the first partition plates 64. Further, the second partition plates 65 may be connected only to the second wall 62b.

The cooling medium flow space 63 includes a first region 631 that exists in the center of the cooling plate 62, second regions 632a and 632b on both sides of the first region 631, and third regions 633a and 633b on both sides of the second regions 632a and 632b. Each first partition plate 64 exists between adjacent regions.

The first region 631 is a wide region in the center of the cooling plate 62, which guides the cooling medium introduced from the cooling medium inlet 63a to the other long side, and five second partition plates 65 are arranged along the short-side direction inside the first region 631 such that the first region 631 is divided into six areas to form flow paths. The five second partition plates 65 of the first region 631 are not in contact with the long-side walls of the cooling plate 62, and the cooling medium introduced into the cooling medium flow space 63 from the cooling medium inlet 63a close to one long side reaches the other long-side wall through the flow paths formed by the six divisions. A distribution plate 66 is provided in the center of the other long-side wall, such that the cooling medium is distributed to both sides, flows through the flow paths along the long-side direction, and reaches the second regions 632a and 632b present on both sides of the first region.

The first partition plates 64 between the first region 631 and the second regions 632a and 632b are provided to extend in the short-side direction from the one long-side wall close to the cooling medium inlet 63a.

In the second regions 632a and 632b, the cooling medium of which flow direction is curved from the first region 631 by the first partition plates 64 flows in the direction from the other long side toward the one long side. In each of the second regions 632a and 632b, one second partition plate 65 is disposed along the short-side direction such that the second region is divided into two areas to form the flow paths.

The first partition plates 64 between the second regions 632a and 632b and the third regions 633a and 633b are provided to project from the other long-side wall opposite to the cooling medium inlet 63a in the short-side direction.

In the third regions 633a and 633b, the cooling medium of which flow direction is curved from the second regions 622a and 632b by the first partition plates 64 flows in the direction from the one long side toward the other long side.

In each of the third regions 633a and 633b, two second partition plates 65 are arranged along the short-side direction such that the third region is divided into three areas to form the flow paths.

The cooling medium outlets 63b are connected to the third regions 633a and 633b. The cooling medium flows through the flow paths of the third regions 633a and 633b, and then, is discharged from the cooling medium outlets 63b.

The power supply 33 is configured to supply a power to the target 31 via the cooling plate 62, and the cooling plate 62 functions as a target electrode. The power supply 33 may be a DC power supply or an AC power supply. When the target 31 is made of a conductive material, a DC power supply is used as the power supply 33, and a negative DC voltage is applied to the cooling plate 62. When the target 31 is made of an insulating material, an AC power supply is used as the power supply 33.

The magnet assembly 34 is provided close to the side of the target cooler 32 opposite to the target 31, that is, close to the base plate 61. The magnet assembly 34 includes two magnets 71 and 72 and a magnet driving unit 73. The magnets 71 and 72 are intended to apply leakage magnetic fields to the target 31 so as to perform a magnetron sputtering, and configured such that the longitudinal direction of the magnets 71 and 71 coincides with the short-side direction of the target 31. The magnets 71 and 72 are provided to be oscillatable in the long-side direction of the target 31, and driven by the magnet driving unit 73. The two magnets 71 and 72 are arranged at an interval, and configured to be oscillated while maintaining the interval. Specifically, the magnet 71 is oscillated between one end of the target 31 (the left end in the drawing) represented by a solid line and the position near the center of the target 31 represented by a dashed line, and the magnet 72 is oscillated between the position near the center of the target 31 represented by a solid line and the other end of the target 31 (the right end in the drawing) represented by a dashed line.

Figure 5:
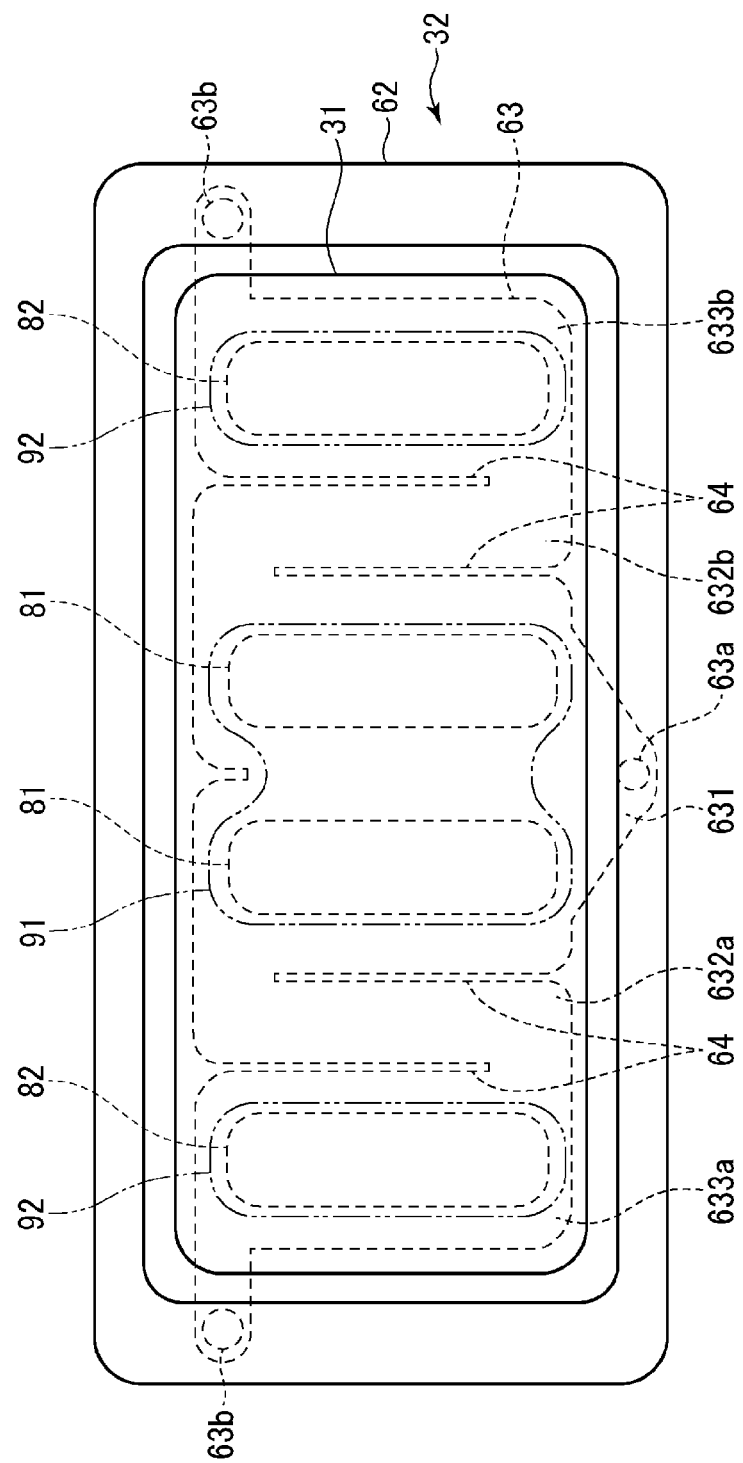
FIG. 5 is a plan view illustrating a relationship between magnet stop positions in the cathode unit and a high temperature region of a target according to the embodiment.

During the sputtering film formation, the magnets 71 and 72 are oscillated so that the uniformity of the leakage magnetic fields is implemented. However, even though the magnets 71 and 72 are oscillated, the moving speed of the magnets decreases near the direction switching positions when the magnets 71 and 72 are oscillated, and as a result, the leakage magnetic fields become locally strong in the vicinity of the stop positions. Specifically, as illustrated in FIG. 5, the leakage magnetic fields become locally strong at the portions of the target 31 that correspond to the vicinities of central magnet stop positions 81 and end-side magnet stop positions 82 of the magnets 71 and 72. Thus, during the sputtering film formation, the heating by plasma becomes further strong at the regions that include the portions described above, and the regions become relatively high temperature regions. Then, an erosion progresses in the relatively high temperature regions. In particular, since the central magnet stop positions 81 of both the magnets 71 and 72 are close to each other so that the leakage magnetic fields from the magnets 71 and 72 present at the magnet stop positions 81 overlap with each other in the target 31, the temperature of the target 31 further increases at the corresponding portions, and the erosion further progresses. Hereinafter, the region of the target 31 that corresponds to the two central magnet stop positions 81 will be referred to as a first high temperature region 91, and the regions of the target 31 that correspond to the end-side magnet stop positions 82 will be referred to as second high temperature regions 92.

In the present embodiment, the positions of the first partition plates 64 and the second partition plates 65 in the cooling medium flow space 63 of the cooling plate 62 described above are set in consideration of the existence of the first high temperature region 91 and the second high temperature regions 92 that become the relatively high temperature regions. That is, as illustrated in FIG. 5, the first partition plates 64 connected to the first wall 62a and the second wall 62b are not disposed at the portions of the cooling plate 62 that correspond to the first and second high temperature regions 91 and 92, and only the second partition plates 65 are disposed at the same portions (FIG. 5 illustrates only the first partition plates 64). Specifically, the first region 631 of the cooling medium flow space 63 is associated with the central first high temperature region 91, and the third regions 633a and 633b of the cooling medium flow space 63 are associated with the end-side second high temperature regions 92.

In this way, the first partition plates 64 connected to the first wall 62a and the second wall 62b do not exist at the portions of the cooling medium flow space 63 that correspond to the relatively high temperature regions of the target 31, and only the second partition plates 65 connected to only one wall exist at the same portions. Since the portions of the cooling plate 62 that correspond to the relatively high temperature regions of the target 31 are flexible and deformable, the detachment caused from the thermal expansion of the target 31 is suppressed.

Meanwhile, the first partition plates 64 are disposed at the portions of the cooling plate 32 where the temperature is relatively low between the stop positions, to allow the curve of the flow direction of the cooling medium, and maintain the rigidity of the cooling plate 32.

Figure 6:
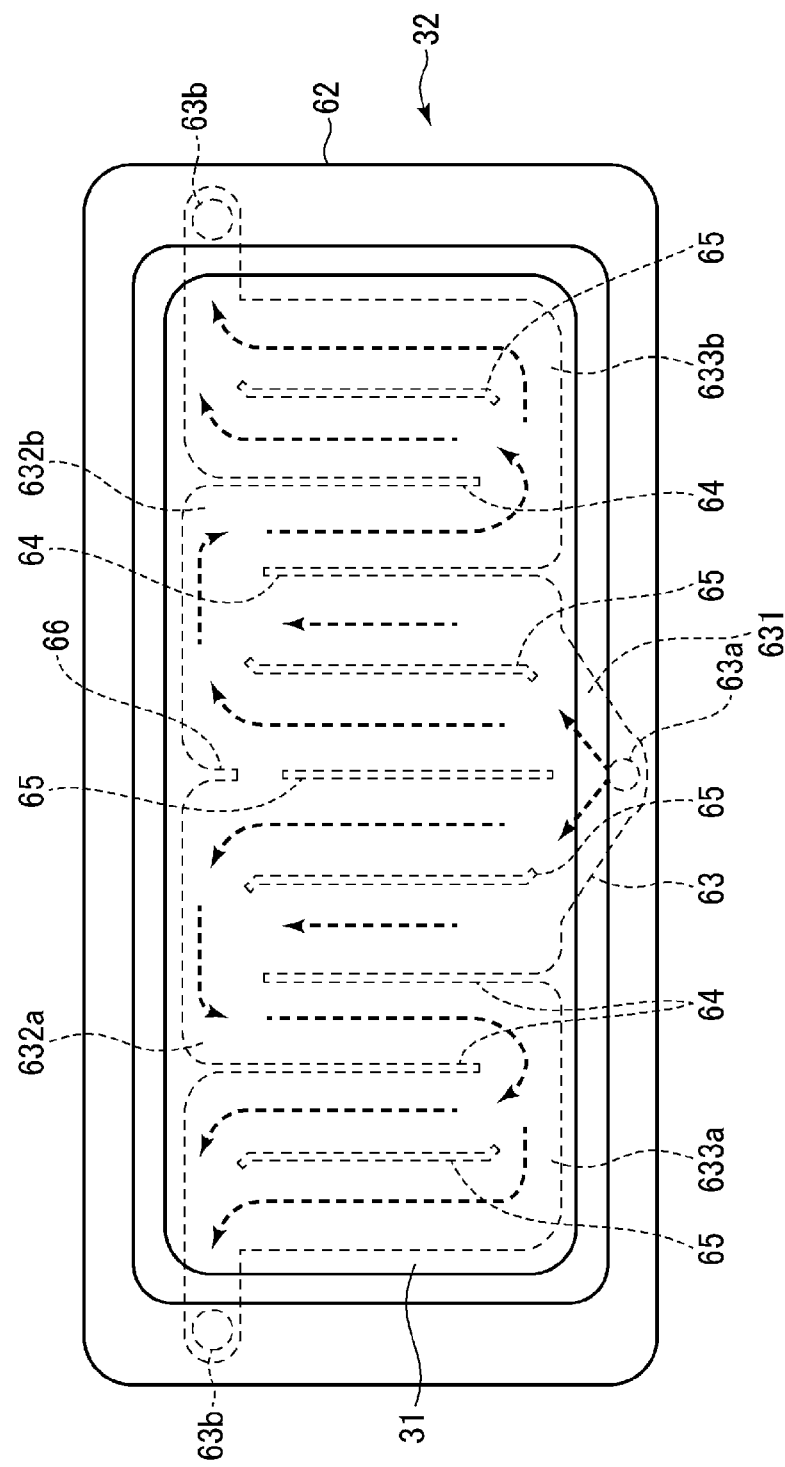
FIG. 6 is a plan view illustrating an example of a cathode unit that uses a cooling medium flow path in which the number of second partition plates is changed.

Further, in the present embodiment, the number of the second partition plates 65 in the cooling medium flow space 63 of the cooling plate 62 is free as long as the cooling medium may flow in the rectified state. For example, as illustrated in FIG. 6, three second partition plates 65 may be provided in the first region 631, one second partition plate 65 may be provided in each of the third regions 633a and 633b, and no second partition plate 65 may be provided in the second regions 632a and 632b.

Further, the configuration of the flow paths of the cooling medium flow space may not be limited to the example of FIG. 4 in which the cooling medium inlet is provided at the center of one long side of the cooling plate 62, and the cooling medium outlets are provided at both short sides of the cooling plate 62 close to the other long side of the cooling plate 62. The configuration may be freely set according to the positions and the number of the relatively high temperature regions of the target 31.

<Operation of Film Forming Apparatus>

Next, the operation of the film forming apparatus configured as described above will be described.

First, a gate valve 14 is opened, and the substrate W is carried into the processing container 10 from a transfer chamber (not illustrated) adjacent to the processing container 10 by a transfer device (not illustrated) and held by the substrate holder 20.

Then, the inside of the processing container 10 is evacuated, and controlled to a predetermined pressure. Next, the target 31 to be used is shielded and discharged in advance by the shutter 50 to clean the surface of the target 31. Then, the unused targets 31 are shielded by the shutter 50, and the film forming process is started in a state where the opening 51 is associated with the target 31 to be used.

An inert gas, for example, Ar gas is introduced from the gas supply 40 into the processing container 10. Next, a voltage is applied from the power supply 33 to the target 31 via the target cooler 32, so as to excite the Ar gas. At this time, the leakage magnetic fields of the magnets 71 and 72 are applied to the periphery of the target, and thus, plasma is concentrated around the target 31 so that magnetron plasma is formed. In this state, positive ions in the plasma collide with the target 31, the elements of the positive ions are released as sputtering particles from the target 31, and the sputtering particles are deposited on the substrate W by the magnetron sputtering.

In the magnetron sputtering film formation, the temperature of the target 31 increases due to the plasma. Thus, the cooling plate 62 with the cooling medium flow space 63 formed therein is provided close to the back surface of the target 31, the target 31 is bonded to the cooling plate 62, and the cooling medium flows through the flow paths of the cooling medium flow space 63 so as to cool the target 31.

However, when the target 31 is cooled by only the cooling medium, the target 31 may not be sufficiently cooled, and as a result, the cooling plate 62 may be detached due to the thermal deformation of the target 31 caused from the local heating of the target 31.

Thus, in the present embodiment, the magnets 71 and 72 are oscillated from the viewpoint of applying the leakage magnetic fields as uniformly as possible when the leakage magnetic fields are applied from the magnets 71 and 72 to the target 31 in order to generate the magnetron plasma.

However, as described above, in the target 31, the leakage magnetic fields become locally strong in the vicinity of the stop positions of the magnets 71 and 72 (the central magnet stop positions 81 and the end-side magnet stop positions 82). As a result, at the corresponding portions of the target 31, the heating by the plasma further progresses so that the first and second high temperature regions 91 and 92 which are the relatively high temperature regions are formed, and further, the erosion also progresses. In particular, since the central magnet stop positions 81 of the magnets 71 and 72 are close to each other so that the leakage magnetic fields from the magnets 71 and 72 present at the stop positions 81 overlap with each other in the target 31, the temperature of the target 31 further increases at the first high temperature region 91 that corresponds to the stop positions, and the erosion further progresses.

When the target 31 is locally heated to a high temperature as described above, a deformation occurs at the corresponding portions of the target 31 due to the thermal expansion, and the target 31 may be easily detached from the target cooler 32. In particular, when the target 31 is made of a relatively low thermal expansion material having a lower thermal conductivity than that of Co, for example, Ti or ceramics (e.g., alumina), a heat transfer hardly occurs, and thus, the tendency of deformation becomes more remarkable.

Further, as the erosion progresses at the locally heated portions of the target 31, the portions become thinner, and may be more easily deformed. When the target 31 is detached from the target cooler 32, the target 31 is hardly cooled by the target cooler 32, and thus, may be melted.

Thus, in the present embodiment, the first partition plates 64 connected to the first wall 62a and the second wall 62b do not exist at the portions of the cooling medium flow space 63 that correspond to the first high temperature region 91 and the second high temperature regions 92, and only the second partition plates 65 connected to only one wall exist at the same portions. As a result, the portions of the cooling plate 62 that correspond to the relatively high temperature portions of the target 31 are flexible, and are allowed to be deformable in response to the deformation of the target 31 caused from the thermal expansion of the target 31. Thus, the target 31 is suppressed from being detached from the target cooler 32 (the cooling plate 62) due to the deformation caused from the thermal expansion, so that the target 31 is prevented from being melted. Meanwhile, with only the second partition plates 65, the cooling medium may leap over at the curves of the flow paths and entrain a gas, and further, the rigidity of the cooling plate 62 may not be maintained. Thus, the first partition plates 64 connected to the first wall 62a and the second wall 62b are necessary. Since the first partition plates 64 are provided at the portions that each correspond to the portion which becomes the relatively low temperature portion between the stop positions, the first partition plates 64 do not disturb the deformation of the cooling plate 62 in response to the thermal deformation of the relatively high temperature portions of the target 31.

While the first high temperature region 91 that corresponds to the two central magnet stop positions 81 becomes hotter due to the overlap of the leakage magnetic fields, and especially, is greatly deformed, the corresponding portion of the cooling plate 62 may be deformed in response of the deformation of the first high temperature region 91. That is, since the portion of the cooling medium flow space 63 that corresponds to the overlapping region is entirely the wide first region 631 where the first partition plates 64 do not exist, the corresponding portion of the cooling plate 62 may be greatly deformed in response to the great deformation of the target 31.

Further, in the present embodiment, not only the portion of the cooling plate 62 that corresponds to the first high temperature region 91 with the highest temperature, but also the portions of the cooling plate 62 that correspond to the second high temperature regions 92 serve as deformable regions where the first partition plates 64 do not exist. However, when the deformation of the target 31 is small in the second high temperature regions 92, only the portion that corresponds to the first high temperature region 91 may serve as a deformable region.

<Other Embodiments>

Next, other embodiments will be described.

Figure 7:
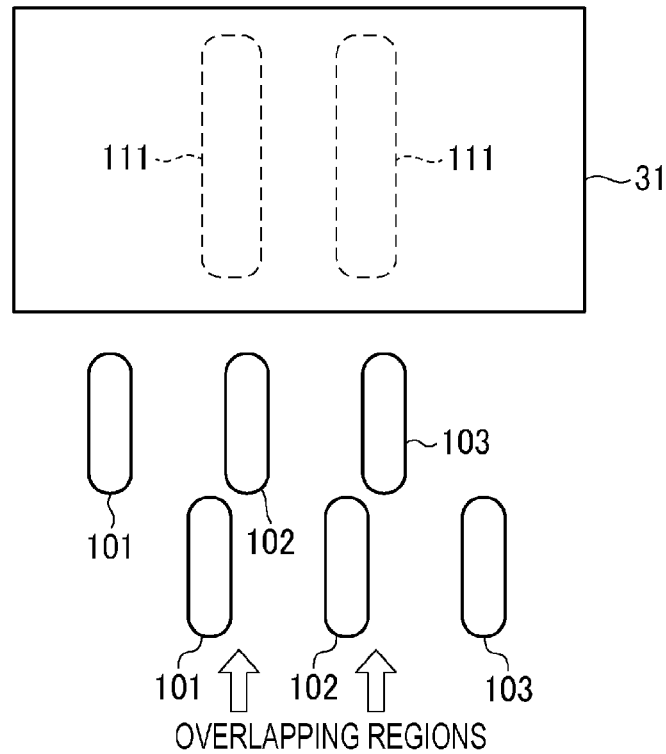
FIG. 7 is a view illustrating an oscillation mode of magnets and the high temperature region of the target when three magnets are provided.
Figure 8:
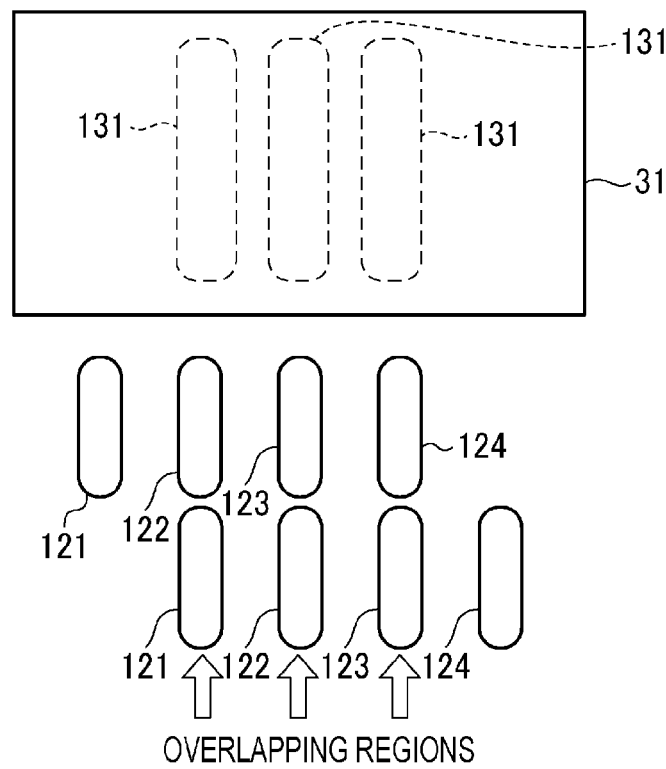
FIG. 8 is a view illustrating an oscillation mode of magnets and the high temperature region of the target when four magnets are provided.

The number of magnets in the magnet assembly 34 is not limited to two, and may be one or three or more. FIG. 7 is an example in which three magnets are provided, and FIG. 8 is an example in which four magnets are provided. FIGS. 7 and 8 represent the relationship between the high temperature regions (erosion regions) of the target 31 and the arrangement of the magnets. The upper arrangement of the magnets represents the initial arrangement of the magnets, and the lower arrangement of the magnets represents the arrangement when the magnets are oscillated from the initial position to the maximum.

When three magnets are provided, for example, as illustrated in FIG. 7, three magnets 101, 102, and 103 are oscillated in the long-side direction of the target 31. At this time, the stop positions of the respective magnets are close to each other at two positions, and the leakage magnetic fields generated from the magnets present at the close stop positions overlap with each other in the target 31 so that two overlapping regions are formed. As a result, the two overlapping regions on the target 31 become relatively high temperature regions 111.

When four magnets are provided, for example, as illustrated in FIG. 8, four magnets 121, 122, 123, and 124 are oscillated in the long-side direction of the target 31. At this time, the stop positions of the respective magnets are close to each other at three positions, and the leakage magnetic fields generated from the magnets present at the overlapping stop positions also overlap with each other in the target 31 so that three overlapping regions are formed. As a result, the three overlapping regions on the target 31 become relatively high temperature regions 131.

In the examples of FIGS. 7 and 8 as well, the regions where the first partition plates 64 do not exist may be formed in the cooling medium flow space 63 of the cooling plate 62 to correspond to the relatively high temperature regions of the target 31, so that the cooling plate 62 may be deformed in response to the thermal deformation of the target 31.

Figure 9:
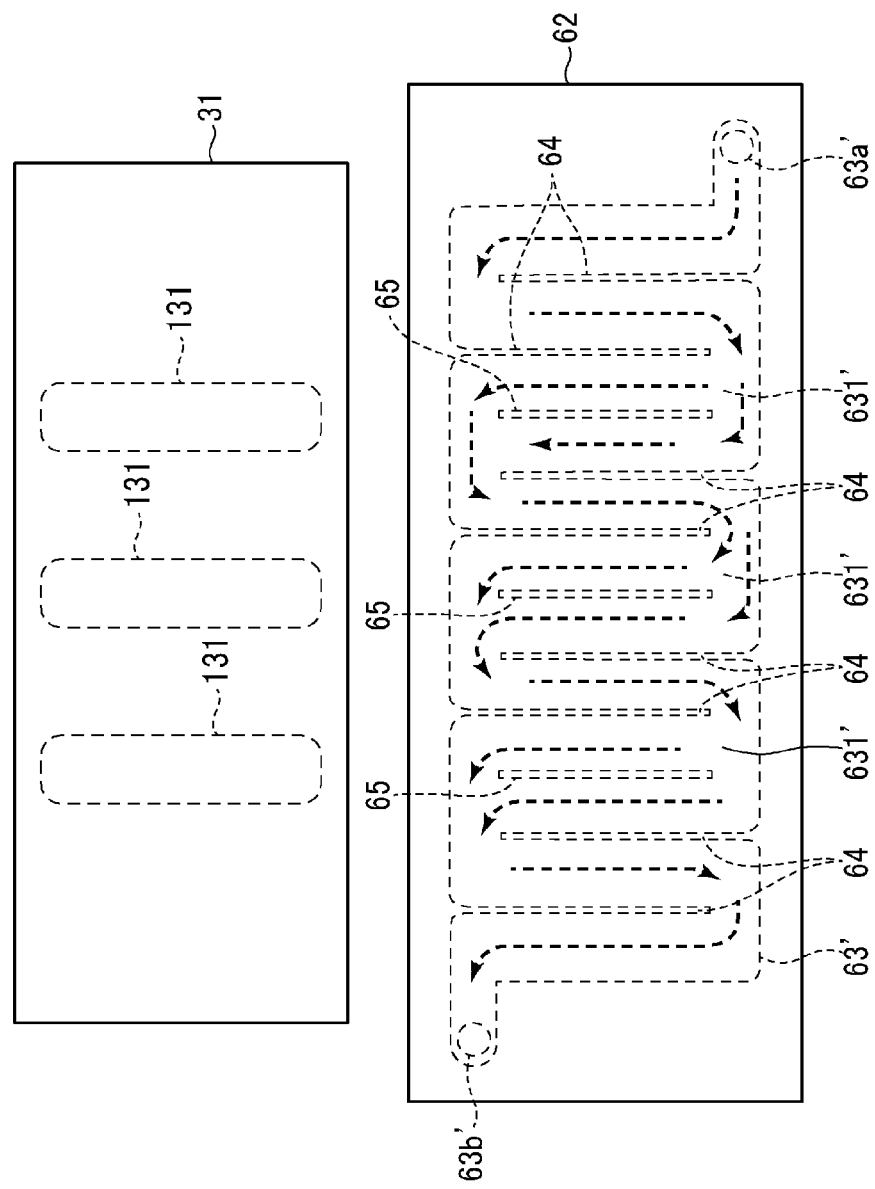
FIG. 9 is a view illustrating another example of the cooling medium flow path of a cooling plate, and a relationship between the structure of the cooling medium flow path and the high temperature region of the target.

Further, the configuration of the flow paths in the cooling medium flow space formed in the cooling plate 62 is not limited to the configuration illustrated in FIG. 4. For example, as illustrated in FIG. 9, a cooling medium flow space 63' may be provided having a flow path configuration in which the cooling medium is introduced from one end of the cooling plate 62 close to one long side thereof, and discharged from the other end of the cooling plate 62 close to the other long side thereof. In the cooling medium flow space 63' of FIG. 9, a cooling medium inlet 63a' exists at one end of the cooling plate 62 close to one long side thereof, and a cooling medium outlet 63b' exists at the other end of the cooling plate 62 close to the other long side thereof. The cooling medium flow space 63' is partitioned by a plurality of first partition plates 64 that extends in the short-side direction, so that the flow paths are formed. As described above, the first partition plates 64 are connected to both the first wall 62a and the second wall 62b of the cooling plate 62. As for the plurality of first partition plates 64, a first partition plate 64 that extends from the one long-side wall in the short-side direction and a first partition plate 64 that extends from the other long-side wall in the short-side direction are provided alternately, and a flow path of which flow direction is curved is formed by each first partition plate 64.

FIG. 9 represents the cooling medium flow space 63' applicable in a case where three relatively high temperature regions 131 are formed at three positions on the target 31 using the four magnets of FIG. 8. That is, the spacing between the first partition plates 64 is adjusted such that the first partition plates 64 do not exist in flow path regions 631' of the cooling medium flow space 63' that correspond to the three relatively high temperature regions 131. In each flow path region 631', a second partition plate 65 that extends in the short-side direction is provided so that two flow paths are formed. As described above, the second partition plate 65 is connected to only the first wall 62a of the cooling plate 62, extends in the short-side direction without being in contact with the long-side walls, and has a function of guiding the cooling medium in the rectified state.

In the cooling plate 62 in which the cooling medium flow space 63' illustrated in FIG. 9 is formed, the regions where the first partition plates 64 do not exist may also be formed corresponding to the relatively high temperature regions of the target 31, so that the cooling plate 62 may be deformed in response to the thermal deformation of the target 31.

Further, in the case of the cooling medium flow space 63' illustrated in FIG. 9, not only the cooling plate 62 may be horizontal in the long-side direction, but also the cooling plate 62 may be inclined in the long-side direction by raising the end of the cooling plate 62 close to the cooling medium outlet 63b' in the long-side direction, and lowering the end of the cooling plate 62 close to the cooling medium inlet 63a' in the long-side direction. In this arrangement as well, a gas is hardly entrained into the cooling medium. The inclination in the long-side direction is arbitrary. In this case, the target 31 may also be provided to be not only horizontal in the long-side direction but also inclined as described above. In this way, the flow paths of the cooling medium flow space is not limited to the example of FIG. 9 in which the cooling medium inlet is provided at the end of the cooling plate close to one long side thereof, and the cooling medium outlet is provided at the end of the cooling plate close to the other long side, and may be freely set according to the positions and the number of the relatively high temperature regions of the target 31.

For example, in the embodiments described above, the magnetron sputtering using magnets has been described. However, the present disclosure is not limited thereto as long as the target becomes locally hot. Further, the design of the flow paths of the cooling medium flow space may also be variously modified according to the positions and the number of the relatively high temperature regions of the target.

According to the present disclosure, it is possible to provide a cathode unit and a film forming apparatus which are capable of suppressing the detachment caused from the thermal expansion of a target heated during a sputtering.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A cathode unit for performing a sputtering film formation, the cathode unit comprising:
   a rectangular target configured to emit sputtering particles;
   a target cooler including a rectangular cooling plate made of a metal to which the rectangular target is bonded; and
   a power supply configured to supply a power to the rectangular target,
   wherein the rectangular cooling plate includes a coolant flow space through which a coolant flows, a first long wall and a second long wall that define the coolant flow space in a thickness direction, and short sidewalls that enclose the coolant flow space in a width direction,
   wherein the short sidewalls comprise a first pair of sidewalls facing each other and a second pair of sidewalls facing each other,
   wherein the coolant enters the coolant flow space through a coolant inlet that is provided at a center of the first long wall, and wherein the coolant exits the coolant flow space via a first coolant outlet and a second coolant outlet formed respectively in each of the short sidewalls, wherein in the coolant flow space, a flow path of the coolant is formed by a plurality of first partition plates connected to the first long wall, the second long wall and the short sidewalls, and a plurality of second partition plates connected to only one of the first long wall and the second long wall, and
   at least one of the first partition plates is disposed between two adjacent second partition plates, wherein the first partition plates and the second partition plates extend in a direction of shorter sides of the rectangular cooling plate, at least one of the first partition plates is connected to only one sidewall of the first pair of sidewalls, and wherein the first partition plates define a curve of the flow path of the coolant flow space.

2. The cathode unit according to claim 1, wherein the rectangular cooling plate includes any one of aluminum, copper, molybdenum, and stainless steel.

3. The cathode unit according to claim 1, wherein the target cooler includes a base plate that supports the rectangular cooling plate.

4. The cathode unit according to claim 3, wherein the rectangular cooling plate and the base plate are integrated with each other.

5. The cathode unit according to claim 1, wherein the rectangular target is made of a low thermal conductivity material having a thermal conductivity lower than that of cobalt.

6. The cathode unit according to claim 5, wherein the rectangular target is made of titanium or ceramics.

7. The cathode unit according to claim 1, wherein the rectangular target and the rectangular cooling plate are bonded to each other by a bonding material including indium, gallium, tin, silver, or an alloy thereof.

8. A film forming apparatus comprising:
   a processing container;
   a substrate holder configured to hold a substrate inside the processing container;
   the cathode unit according to claim 1 disposed above the substrate holder;
   a magnet assembly including a magnet configured to apply a leakage magnetic field to the rectangular target, thereby performing magnetron sputtering, and a driver configured to oscillate the magnet in a direction of longer sides of the rectangular target; and
   a gas channel configured to introduce a plasma generation gas into the processing container.

9. The film forming apparatus according to claim 8, wherein the magnet is disposed such that a longitudinal direction of the magnet coincides with a direction of the shorter sides of the rectangular target.

10. The film forming apparatus according to claim 8, wherein the first partition plates exist only at a first portion of the coolant flow space except a second portion of the coolant flow space corresponding to a stop position of the magnet when the magnet is oscillated.

11. The film forming apparatus according to claim 8, wherein the magnet assembly includes a plurality of magnets, and
   stop positions of the respective magnets are close to each other or overlap with each other when the plurality of magnets are oscillated, and the first partition plates exist only at a first portion of the coolant flow space except a second portion of the coolant flow space corresponding to a portion of the rectangular target where leakage magnetic fields generated from the magnets present at the stop positions overlap with each other.

* * * * *